United States Patent [19]

Rostoker

[11] Patent Number: 5,320,864
[45] Date of Patent: Jun. 14, 1994

[54] SEDIMENTARY DEPOSITION OF PHOTORESIST ON SEMICONDUCTOR WAFERS

[75] Inventor: Michael D. Rostoker, San Jose, Calif.

[73] Assignee: LSI Logic Corporation, Milpitas, Calif.

[21] Appl. No.: 906,902

[22] Filed: Jun. 29, 1992

[51] Int. Cl.$^5$ .............................................. B05D 1/00
[52] U.S. Cl. ........................................ 427/58; 427/96; 427/443.2; 430/169; 430/935
[58] Field of Search ................ 427/96, 443.2, 58; 430/169, 935

[56] References Cited

U.S. PATENT DOCUMENTS

| | | | |
|---|---|---|---|
| 4,402,128 | 9/1983 | Blackstone | 29/591 |
| 4,506,434 | 3/1985 | Ogawa | 29/571 |
| 4,541,169 | 9/1985 | Bartush | 29/591 |
| 4,665,007 | 5/1987 | Cservak | 430/311 |
| 4,672,023 | 6/1987 | Leung | 430/311 |
| 4,698,128 | 10/1987 | Berglund | 156/643 |
| 4,762,396 | 8/1988 | Dumant | 350/320 |
| 4,873,176 | 10/1989 | Fisher | 437/228 |
| 4,906,852 | 3/1990 | Nakata | 250/548 |
| 4,912,022 | 3/1990 | Urquhart | 430/396 |
| 4,929,992 | 5/1990 | Thomas | 257/382 |
| 4,977,330 | 12/1990 | Batchelder | 250/560 |
| 5,001,040 | 3/1991 | Blakeney | 430/330 |
| 5,002,851 | 3/1991 | Toukhy | 430/192 |
| 5,055,871 | 10/1991 | Pasch | 355/53 |
| 5,063,138 | 11/1991 | Salamy | 430/169 |
| 5,075,257 | 12/1991 | Hawk | 437/225 |
| 5,177,172 | 1/1993 | Toukhy | 430/326 |
| 5,178,955 | 1/1993 | Aharoni | 428/421 |
| 5,178,986 | 1/1993 | Zampini | 430/326 |
| 5,178,989 | 1/1993 | Heller | 156/625 |

Primary Examiner—Shrive Beck
Assistant Examiner—Vi Duong Dang
Attorney, Agent, or Firm—Gerald E. Linden

[57] ABSTRACT

A conformal, substantially uniform thickness layer of photoresist is deposited on a semiconductor wafer by causing photoresist solids to "sediment" out of solution or suspension. Generally, the more conformal the layer, the more uniform the reflectance of the layer and the less variation in underlying feature critical dimension (cd). In order to accommodate possible resulting deviations in photoresist layer thickness causing undesirable reflectance nonuniformities (and cd variations), a top antireflective coating may be applied to the photoresist layer. In the case of a point-by-point lithography process, such as e-beam lithography, the thickness/reflectance variations can be mapped, and exposure doses adjusted accordingly.

17 Claims, 3 Drawing Sheets

SEDIMENTARY DEPOSITION OF PHOTORESIST ON SEMICONDUCTOR WAFERS

TECHNICAL FIELD OF THE INVENTION

The invention relates to the fabrication of integrated circuit (IC) semiconductor devices, and more particularly to depositing a thin layer (film) of photoresist over a semiconductor wafer (substrate), more particularly a "topographical" (irregular front surface) wafer.

BACKGROUND OF THE INVENTION

Photolithography is a common technique employed in the manufacture of semiconductor devices. Typically, a semiconductor wafer is coated with a layer (film) of photo-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern of lines on the mask.

This is all good in theory, until one recognizes that the uniformity of the illuminating light varies, typically at the source of the light, and that such non-uniformity will manifest itself as variations in the size of features (e.g., photoresist lines) that can be created on the wafer. To the end of uniformizing the light incident on and passing through the mask, various techniques have been proposed, among these a technique discussed in commonly-owned U.S. Pat. No. 5,055,871 (Pasch).

The ultimate goal of uniformizing (homogenizing) the incident light is that the illumination uniformity (i.e., non-uniformity) of photolithographic apparatus will often set a limit to how small a feature, such as a line, can be imaged in a manufacturing environment. And, as a general principle, being able to create smaller integrated circuit features is better (faster, more compact, etc.).

Of no less concern than the ultimate size (smallness) of features, is the ability to control the critical dimension ("cd") from one feature to another. For example, since size generally equates with speed (e.g., smaller is generally faster), it is disadvantageous to have one feature, such as a polysilicon ("poly") gate, smaller (and faster) than another poly gate on the same device. Conversely, it is highly desirable to fabricate all similar features (e.g., poly gates) to be the same size (i.e., with the same "cd"), especially in gate-array or cell type devices, and combinations thereof, such as Application Specific Integrated Circuits (ASICs), including ASICs with on-chip memory.

In addition to nonuniform illumination, another cause of variation in "cd" is nonuniformity of the thickness of films overlying an irregular topography on the wafer surface. Prior to the numerous steps involved in fabricating integrated circuit devices on a semiconductor wafer, the wafer is initially fairly flat—exhibiting a relatively regular topography. However, prior structure formation often leaves the top surface topography of the silicon wafer highly irregular, with bumps, areas of unequal elevation, troughs, trenches and/or other surface irregularities. As a result of these irregularities, deposition of subsequent layers of materials could easily result in incomplete coverage, breaks in the deposited material, voids, etc., if it were deposited directly over the aforementioned highly irregular surfaces. If the irregularities are not alleviated at each major processing step, the top surface topography of the surface irregularities will tend to become even more irregular, causing further problems as layers stack up in further processing of the semiconductor structure.

As mentioned above, the application and patterning of photoresist is typically a key step in the fabrication of complex integrated circuit devices, and is a procedure that may be repeated at several different times throughout the fabrication process.

It has been noticed, and is generally known, that the thickness of a subsequently applied film, particularly a layer of photoresist, will vary (in a generally non-predictable manner) depending upon the irregular topography of the underlying surface. (Application of an overlying film to a flat, regular surface is generally not a problem.) For example, a photoresist layer, even if spun-on, will exhibit a different thickness, from point-to-point over the wafer (and within the area of a given device) depending on the irregular topography of underlying features.

This variation in the thickness of photoresist over an irregular topography is graphically illustrated in FIG. 1A.

FIG. 1A shows a portion of a semiconductor wafer 110 which has been processed to develop raised structures 112a, 112b and 112c of Field Oxide (FOX), between which are active areas (islands) 114a and 114b having a lower elevation (e.g., at wafer level). The island 114a between the FOX structures 112a and 112b has a width $w_1$ substantially smaller than the width $w_2$ of the island 114b between the FOX structures 112b and 112c. Having islands of different widths is not uncommon. For example, the island 114a may be an "array island" having a width $w_1$ on the order of 3 microns, and the island 114b may be an "I/0 (Input/Output) island" having a width $w_2$ on the order of hundreds of microns. Both types of islands are usually required for an integrated circuit device, and it is not uncommon to have widely varying island sizes in a single device. In any case, the island areas are usually lower (less elevated) than the field oxide areas.

An overlying layer 120 of polysilicon ("poly") is deposited over the wafer, which already exhibits an irregular topography. This is according to known techniques, and is presented herein by way of example only.

An overlying film (layer) 130 of photoresist is applied, in any suitable manner, over the poly layer 120, and photolithographically treated to create etch-resistant "lines" (photochemically-converted areas) 132 and 134 over the active areas 114a and 114b, respectively. The line features 132 and 134 are shown in reverse cross-hatch from the remainder of the film 130.

Ultimately, the photoresist layer 130 is etched (or washed) away, leaving only a pattern of photochemically-converted areas 132 and 134 overlying the ploy 120. In subsequent fabrication steps, the wafer is etched (chemical, plasma, etc.), so that all but discrete poly regions 122 and 124 (shown in reverse cross-hatch) underlying respective photoresist features 132 and 134, respectively, are removed from the surface of the wafer. With additional processing, not shown, the poly regions 122 and 124 may perform as gates.

Since electron flow in the lateral direction (i.e., plane of the wafer) is of primary concern in the performance of circuit elements (e.g., poly gates), the transverse dimension of the poly gates 122 and 124 parallel to the plane of the wafer is of paramount interest. For purposes of this discussion, this transverse dimension is termed a "critical dimension", or "cd." The poly gate 122 has a first cd, designated "cd1", and the poly gate 124 has a second cd, different from the first cd, designated "cd2".

In essence, the cd's of the two poly gates are different, because the width of the respective overlying photoresist features is different. (Generally, the width of a poly gate will be essentially the same as that of the overlying resist feature.)

As mentioned above, it is nearly impossible to apply a uniform layer of photoresist over an irregular surface. Hence, the thickness of the photoresist 130 over the active area 114a (particularly over the area where the poly gate 122 is to be formed) is different (shown thicker) than the thickness of the photoresist 130 over the active area 114b (particularly where the poly gate 124 is to be formed).

It is also generally known, that the reflectance of a film (such as photoresist) will vary with its thickness. Hence, since the thickness of an overlying film at any given point on the surface of the semiconductor wafer (e.g., photoresist) is not uniform, the reflectance is consequently nonuniform from point-to-point across the surface of the wafer.

This indeterminate nature of resist thickness and reflectivity over irregular underlying surfaces has important, negative ramifications in the semiconductor fabrication process, especially in the process of fabricating circuit elements having "critical dimensions".

FIG. 1B illustrates the reflectivity problem, and its manifestation in the size of a photoresist feature. Here, in a photolithographic process, a film 140 of photoresist is exposed to light (arrows ↓ ↓ ↓ ↓) of hypothetically uniform intensity. A mask 150 is interposed in the light path, and is provided with light-transmitting areas (lines) 152 and 154 allowing light (↓ ↓) to impinge upon selected areas 142 and 144, respectively, of the film 140.

In FIG. 1B, the thickness of the film 140 is intentionally shown to be different in the areas 142 and 144. And, as will be seen, it is relatively insignificant that the film is thicker in the area 144 than in the area 142. For purposes of this discussion, depth of field (depth of focus) issues that may arise from projecting a mask image onto a surface of varying height may be ignored.

FIG. 1C illustrates graphically the effect of film thickness (horizontal axis) on reflectivity (i.e., the energy reflected by the film), and relates to the issues raised in FIG. 1B. While there is a general increase in reflectivity with increased thickness, there is a much more profound (generally sinusoidal) pattern of "maxima" 170a, 170b and 170c and "minima" 172a, 172b and 72c, which exhibits that the reflectivity for a given greater film thickness (point 172c) can well be less than the reflectivity for a given lesser film thickness (point 170b). (Dashed horizontal line 174 provided as a visual aid.) Importantly, these variations are dependent on relatively small, e.g., a quarter of a wavelength, variations in the thickness of the film—difficult dimensions to measure, let alone control.

Returning to FIG. 1B, it can be appreciated that it is rather indeterminate how much of the (supposedly uniform) incident energy (↓ ↓ ↓) will be absorbed by the photoresist film, and how much will be reflected, at any given point And, as a general proposition, the more incident energy (↓ ↓ ↓) that is absorbed at a given point, the greater the area of the given feature 142 or 144 will "grow". Of course, the reverse would be true for reverse masking, wherein light acts outside of the desired feature, in which case the more light absorbed—the smaller the feature would be.

In any case, the point is made that an irregular thickness of an overlying film (e.g., photoresist) will impact upon the ultimate critical dimension (cd) of underlying features (e.g., poly gate) being formed, with commensurate undesirable functional effects.

Certainly, if reflectivity issues were ignored, which they cannot be, the widths of all of the photoresist lines and underlying features would be well-controlled. However, because the photoresist thickness varies from point-to-point over the wafer, and consequently its reflectivity varies from point-to-point, the efficiency of the incident light on the photoresist layer will vary commensurately, which will affect the ultimate width of the resist features.

Evidently, the efficiency of the photolithography process is dependent on the ability of the photoresist material to absorb the radiant energy (light), and this ability is, in turn, affected by the thickness/reflectance of the photoresist.

In the prior art, it has been known to compensate approximately for known variations (and to some extend, gross trends can be predicted) in photoresist thicknesses by "differentially biasing" the (photomask) line widths in the high versus low reflectivity areas. And FIG. 1C illustrates that, to some extent, one can reasonably assume that the average reflectivity for an area with greater film thickness will reflect more than an area of lesser thickness. This concept may be employed with respect to relatively large Input/Output (I/0) areas (e.g., 114b) versus relatively small active areas (e.g., 114a).

And, as mentioned before, in the prior art, it has also been known to use "spin-on" or other techniques in an attempt to apply a film (e.g., photoresist) having a relatively planar top surface. Of course, a relatively planar top surface is of little help, and may in fact be antithetical, in uniformizing the thickness of a film over an underlying surface having an irregular topography—in which case the thickness of the film would vary widely from point-to-point. What is really needed is a "conformal" layer, in other words one exhibiting uniform thickness (not necessarily planar) over an irregular wafer surface.

It has also been known to reduce the viscosity of the photoresist so that it goes on in a more planar manner. But, thickness will vary according to the topography of the underlying surface. Further, changing the photoresist chemistry (viscosity) can have adverse side effects, such as poor photolithography resolution.

In the prior art, it has also been known to perform subsequent steps to planarize the photoresist, which can be somewhat effective in overcoming the reflectance issues set forth above - again, so long as the photoresist is planarized over a relatively planar underlying surface.

Prior art techniques for accommodating "cd" variations due to photoresist thickness variations are relatively difficult and time consuming to implement, and may not deliver the desired results.

The following patents, incorporated by reference herein, are cited of general interest: U.S. Pat. Nos. 4,977,330; 4,929,992; 4,912,022; 4,906,852; 4,762,396; 4,698,128; 4,672,023; 4,665,007; 4,541,169; 4,506,434; and 4,402,128.

Disclosure of the Invention

It is a general object of the present invention to provide improved photolithographic (or microlithographic) techniques for the fabrication of semiconductor devices.

It is another object of the present invention to provide a technique for obtaining a uniform film thickness, hence reflectivity of photoresist and/or other masking chemicals, regardless of the topography of an underlying surface, particularly variations in the underlying active area size.

It is another object of the present invention to provide a technique for improving linewidth and cd (critical dimension) uniformity in photolithography (microlithography), without using spin-on techniques and without altering photoresist chemistry.

According to the invention, a "conformal" layer of photoresist is applied (deposited) as a sedimentary layer over an irregular wafer. The sedimentary layer of photoresist is conformal in that it is of substantially uniform thickness irrespective of the topographical variations in the underlying wafer surface. Being conformal, the photoresist layer will exhibit more uniform reflectivity, hence the critical dimension (cd) of underlying features (e.g., polysilicon gates) can better be controlled.

In one embodiment of the invention, a semiconductor wafer is immersed in a solution of photoresist (solids) and solvent. The photoresist solids are then allowed or caused to sediment (precipitate) out of solution, onto the surface of the wafer. A supersaturated solution of photoresist solids in solvent may be employed. An "anti-solvent" may be added to the solution to cause sedimentation. (An anti-solvent is a compound that "reverse biases" the polarity of the solvent, causing the dissolved solids to precipitate out of solution.)

In another embodiment of the invention, a semiconductor wafer is immersed in a suspension of photoresist (solids) and water, preferably de-ionized water. The photoresist solids are then allowed or caused to sediment (precipitate) out of suspension, onto the surface of the wafer. According to a feature of this embodiment, a film of water overlying the photoresist (on the wafer) acts as a top antireflective coating.

By applying a substantially conformal (more uniform thickness) layer of photoresist over a wafer, the reflectivity of the layer is substantially uniformized. Hence, better control over underlying gate size can be directly effected, whereas differential biasing is considered to be a somewhat indirect approach to the problem.

Further according to the invention, the wafer is immersed so that its front surface (upon which devices are fabricated) faces up, when immersed. The wafer may be immersed either: (1) at the bottom of a reservoir containing either a solution or a suspension of photoresist solids; or (2) at a predetermined level in the solution/suspension. Hereinafter, when referring to either the solution or the suspension of photoresist solids, the term "mixture" will be employed, as embracing both possibilities. Further, the term "liquid" will be employed, as embracing both solvents (for solutions) and water (for suspensions).

The wafer may also be "immersed" without a reservoir by coating the front face of the wafer with a solution or suspension (mixture) of photoresist solids, then causing the solids to sediment (precipitate) onto the wafer, then washing (removing) the excess mixture off of the face of the wafer. For example, a mixture having photoresist solids could be spun on to the face of the wafer.

In the case that the wafer is immersed at the bottom of a reservoir containing a mixture of photoresist solids, the ultimate thickness of the photoresist layer on the wafer is preferably determined by controlling the "residence time" of the wafer in the mixture.

In the case that the wafer is immersed at a predetermined level in the mixture of photoresist solids, the ultimate thickness of the photoresist layer on the wafer is preferably determined by the amount of mixture above the wafer, assuming that all of the photoresist solids in this portion of the mixture above the wafer will precipitate onto the surface of the wafer.

By applying the resist as a layer having substantially uniform thickness, reflectivity is uniformized, absorption of incident photolithographic light is uniformized, and better control over feature critical dimension (cd) is effected, especially the cd of features in different topographical areas (e.g., active areas versus I/O areas), or between different sized transistors on an integrated circuit.

In another embodiment of the invention, a thickened mixture (suspension or solution) of photoresist is applied directly to the wafer, without using a reservoir, and the photoresist solids are caused to sediment out of the mixture as a conformal layer of photoresist onto the wafer.

Other objects, features and advantages of the invention will become apparent in light of the following description thereof.

DETAILED DESCRIPTION OF THE INVENTION

Figure 1A:
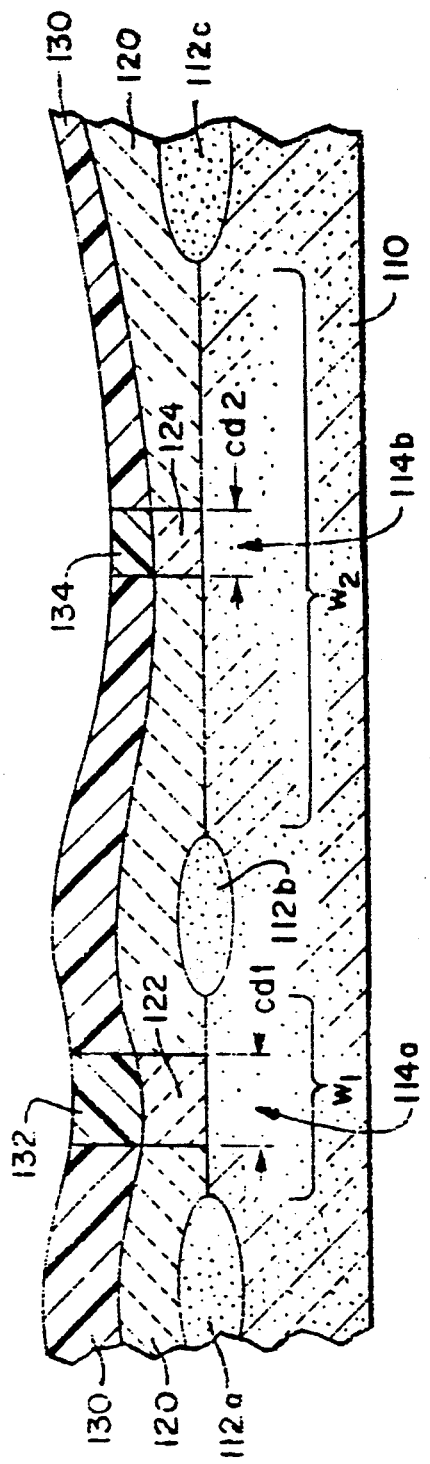
FIG. 1A is a generalized, cross-sectional view of a portion of a semiconductor device (or wafer), and illustrates an exemplary problem in the prior art, which problem is specifically addressed by the present invention.
Figure 1B:
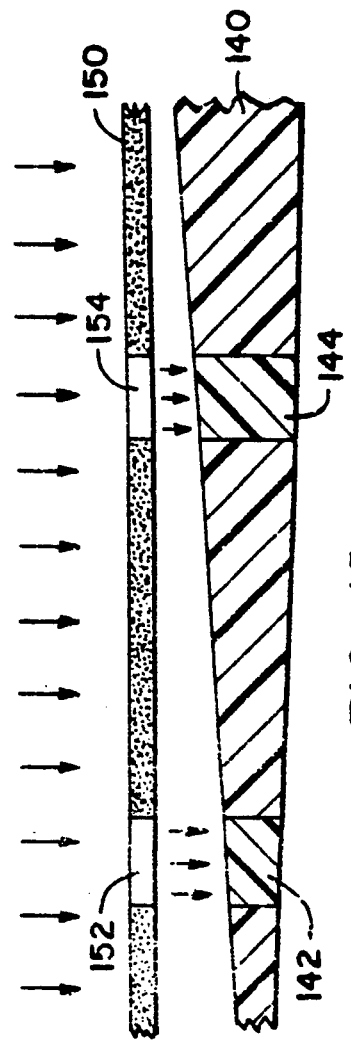
FIG. 1B is a stylized cross-sectional view of a film (layer) of varying thickness, as first discussed with respect to FIG. 1A.
Figure 1C:
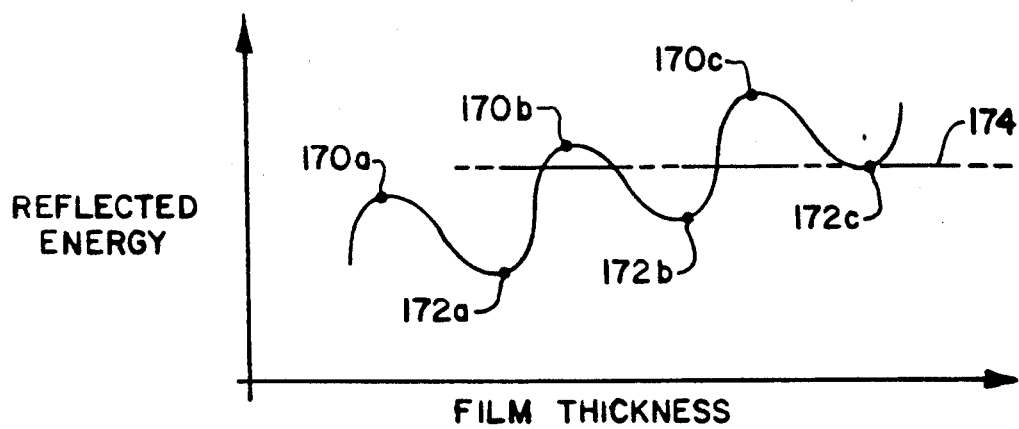
FIG. 1C is a generalized graph of reflectivity (reflected energy) versus film thickness, and relates to FIG. 1B.

FIGS. 1A–1C have been discussed above, and illustrate the impact that nonuniform film thickness (e.g., nonconformal layer of photoresist), and consequent varying film reflectivity, can have, especially in the photolithographic fabrication of polysilicon gates using a patterned photoresist layer (film).

According to the invention, the problem of nonuniform film (e.g., photoresist) thickness exhibiting varying reflectivity is solved, generally, by sedimentary deposition ("precipitating") of photoresist on the front surface of a wafer. Sedimentary deposition is accomplished in one of two manners:

1. Creating a solution, preferably supersaturated, of photoresist solids and solvent, and causing the photoresist to sediment onto the surface of the wafer; or
2. Creating a suspension of photoresist and water, preferably deionized water, and allowing the photoresist to sediment onto the surface of the wafer.

DEPOSITION OF PHOTORESIST

Evidently, if a layer of photoresist, or other suitable photoreactive material, could be applied conformally, with uniform thickness, irrespective of the underlying topography of the substrate, and especially in instances where the underlying topography is irregular, the resulting thickness of the photoresist film would be relatively uniform and would exhibit relatively uniform reflectivity. Hence, the critical dimension (cd) of underlying features being created with the photoresist would tend to be more uniform.

As mentioned hereinbefore, one of the "best" known techniques for applying a film of photoresist is the "spin-on" technique, which strives to create a relatively flat (planar) top surface for the photoresist film. However, having a flat top surface is certainly no guarantee of having a uniform thickness over an irregular underlying topography. To the contrary, having a planar top surface photoresist film over an underlying irregular topography, however this may be achieved is, in many cases, counter-indicative of having a uniform film thickness.

Other, non-related semiconductor fabrication processes teach that various semiconductor materials can be deposited conformally. For example, chemical vapor deposition (CVD) of silicon nitride ("nitride") creates a "blanket" nitride layer which can cover an underlying irregular (non-planar) surface with surprising uniformity of thickness.

By way of further example, U.S. Pat. No. 5,075,257 (Hawk, et. al.), incorporated by reference herein, discloses that silicon may be aerosolized and electrostatically deposited onto various grounded, high melting point substrates. Various preferred parameters are disclosed, relevant to aerosolizing silicon, including silicon powder size and purity, velocity, spacing (from substrate), electrostatic charge level, temperature and time (heat cycle). The references cited in the Hawk et. al. patent, are primarily directed to: other techniques of applying silicon, especially molten silicon; vaporizing-/condensing/re-vaporizing/recondensing solids, especially silicon; and electrodeposition. Each material and each process have their own vagaries and solutions.

TOP ANTIREFLECTIVE COATINGS

Evidently, if a layer of photoresist, or other suitable photoreactive material, having an irregular thickness, could be caused to exhibit uniform reflectivity, the resulting line widths formed therein by photolithography would be more uniform. Hence, the critical dimension (cd) of underlying features being created with the photoresist would be more uniform.

It is therefore known to apply a top antireflective coating (TAR) to the irregular top surface of photoresist over an irregular underlying layer.

Antireflective films, generally, have been known since Fabry/Perot, i.e., about one hundred years, for coating lenses (optics) and the like. Generally, an antireflective film has a refractive index less than that of the material it is coating, and has a thickness of L/4 (one quarter the wavelength "L" of the incident light in the underlying material). The wavelength "of choice" in photolithography is 365 nanometers (nm).

Preferably, according to Fabry/Perot, the refractive index "$n_{TAR}$" of the antireflective coating would be the square root of the refractive index "$n_{OPR}$"

Common photoresist solutions (i.e., 90% ethyl lactate solvent and 10% novolac resin solids) have a refractive index $n_{PR}$ of approximately 1.70, the square root of which is approximately 1.30. Hence, the ideal TAR would have a refractive index $n_{TAR}$ of 1.30.

Water, having a refractive index of approximately 1.30, would therefore make an ideal TAR. Sugar also has a desirable refractive index, but would be expected to crystallize (not desired) on top of photoresist. As will be discussed in greater detail hereinbelow, water may be employed as a top antireflective coating, and is suitably obtained as a byproduct of precipitating photoresist solids out of suspension.

International Business Machines (IBM) is known to use a TAR in semiconductor fabrication having a refractive index of approximately 1.42, which is relatively far removed from the "ideal" of 1.30. As will be discussed in greater detail hereinbelow, any suitable TAR can be applied over the substantially conformal layer of photoresist applied according to the present invention, to compensate for any lingering irregularities in the thickness (hence reflectance) of the photoresist layer.

SOLUTION OF PHOTORESIST

Photoresist is "normally" supplied and applied in a solution of approximately 90% (ninety percent) casting solvent, such as ethyl lactate, and approximately 10% (ten percent) solids, such as novolac resin (diazoquinone). Such a solution having 90% solvent is entirely suitable for normal spin-on and other prior art techniques of applying photoresist to a substrate (wafer).

According to the invention, a wafer is immersed in a solution of photoresist and solvent. The wafer is immersed "face-up" in the solution.

In one scheme, the solvent is allowed to evaporate, and is preferably caused to evaporate at an accelerated rate, such as by applying heat. In this manner, the solution will become supersaturated (high solid content). Contemporaneously (to a limited extent), and subsequently (to a greater extent), upon further evaporation of solvent the photoresist particles will deposit as a sediment upon the face of the wafer.

Figure 2A:
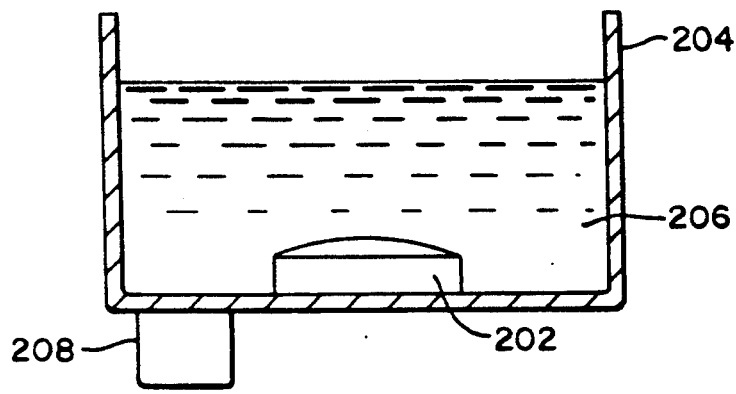
FIG. 2a is a cross-sectional, partially-perspective view of an embodiment of the invention.

FIG. 2a shows apparatus for effecting this method of depositing photoresist upon the face of a wafer.

A semiconductor wafer 202 is immersed in a reservoir 204 containing a solution 206 of photoresist solids and solvent. In this example, the wafer is disposed flat, face up, at the bottom of the reservoir.

In order to apply the photoresist solids as a conformal layer over the front (top, as viewed) surface of the wafer, the solvent is allowed or caused to evaporate out of the solution 206. Preferably, a heating apparatus 208 accelerates the evaporation of the solvent from the solution.

Evidently, a known quantity of photoresist solids are contained in the solution above (as viewed) the wafer. And this quantity of photoresist solids is readily established to be sufficient to form a photoresist layer of desired thickness on the wafer. Preferably, there are more than enough solids contained in the solution above the wafer to form the desired layer. Hence, it is empirically determined how long the wafer needs to be in the solution in order to achieve a sedimentary layer of photoresist of desired thickness. This is referred to as the "residence time" of the wafer in the solution.

Preferably, the solution 206 is supersaturated with photoresist solids. For example, a solution having on the order of equal amounts (50%, 50%) of solids and solvent is created. Prior to immersion of the wafer in such a supersaturated solution, the solution is maintained at an elevated temperature, and is covered (not shown) so that the solvent does not evaporate out to a significant degree. (The boiling pint of ethyl lactate is 154°). Then, the wafer is immersed in the solution. Then, the temperature of the solution is allowed (or caused) to drop. This will accelerate the sedimentary deposition of photoresist particles (solids) onto the face of the semiconductor wafer.

Rather than simply allowing/causing the solvent to evaporate out of the solution, it is also possible to "force" the photoresist solids out of solution. Generally, a solvent such as ethyl lactate has a relatively high "polarity". By adding an "anti-solvent" to the solution, the polarity of the solvent is neutralized ("reverse biased"), and the photoresist material will sediment out of solution. Hexane, being relatively non-polar, will cause this effect. A number of other non-polar materials may be added to the solution to cause the photoresist particles to sediment out of solution. Again, the residence time of the wafer in the solution (after adding the anti-solvent) must be limited to control the thickness of the photoresist layer deposited on the wafer.

Figure 2B:
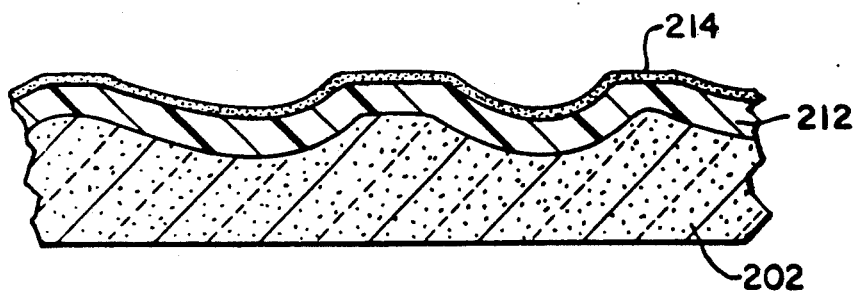
FIG. 2b is a cross-sectional view of a wafer having photoresist deposited sedimentarily, and an overlying top antireflective (TAR) coating, according to the present invention.

FIG. 2b shows the resulting conformal layer of photoresist 212 sedimentarily deposited over a portion of the topographical wafer 202. (This figure is also illustrative of the end result of other embodiments.)

By allowing/causing photoresist particles to deposit themselves sedimentarily upon a topological (irregular surface) wafer, a substantially conformal (uniform thickness) layer of photoresist is created. Hence, reflectivity of the layer is uniformized. Nevertheless, there may be minor variations in the photoresist thickness that will manifest themselves in non-uniform reflectivity, as discussed above.

Therefore, it is also advantageous to apply a suitable top antireflective (TAR) coating, such as IBM's TAR, over the substantially conformal layer of sedimentarily-deposited photoresist. An exemplary TAR is shown in FIG. 2b as thin film 214.

SUSPENSION OF PHOTORESIST

In this embodiment, photoresist particles are suspended (i.e., not dissolved) in a inert (vis-a-vis the photoresist solids) medium, such as water, preferably deionized water.

As in the previous embodiment, a wafer is immersed in the suspension of photoresist and water. Again, the wafer is immersed "face-up" in the suspension. The water may simply be allowed to evaporate, and may also be caused to evaporate at an accelerated rate, such as by applying heat. In relative terms, however, this may take an intolerable amount of time. Preferably, the photoresist particles are caused to sediment out of suspension more quickly.

According to the invention, photoresist particles are "artificially" maintained in suspension (in water) by agitating the suspension. A wafer is immersed in the suspension, agitation is ceased, and the suspension is allowed to become quiescent, at which point the photoresist particles will sediment out of the suspension onto the face of the wafer.

According to the invention, the photoresist particles are maintained in suspension by agitating the suspension with any suitable means, such as with an ultrasonic transducer.

Figure 3:
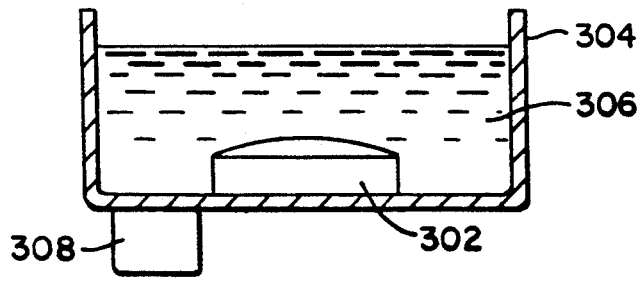
FIG. 3 is a cross-sectional, partially-perspective view of another embodiment of the invention.

FIG. 3 shows apparatus for effecting this method of depositing photoresist upon the face of a wafer.

A semiconductor wafer 302 is immersed in a reservoir 304 containing a suspension 306 of photoresist solids and water. In this example, the wafer disposed at the bottom of the reservoir. An ultrasonic transducer 308 is mounted to the reservoir, and turned on, to keep the photoresist solids in suspension.

The wafer is immersed in the suspension, again at the bottom of the reservoir, the ultrasonic transducer is turned off, and photoresist solids are allowed to precipitate (sediment) onto the face of the wafer. Again, a sufficient quantity of photoresist solids are available in the suspension to create a conformal photoresist layer on the wafer of desired thickness, and the residence time of the wafer in the reservoir (after turning off the transducer) is controlled.

Advantageously, when the wafer is withdrawn from the reservoir, a "residual" thin film of water may remain over the sedimentary layer of photoresist on the wafer. As mentioned above, water has a refractive index well suited to behaving as a top antireflective coating over photoresist. Hence, by depositing photoresist as a sediment from a water-based suspension of photoresist particles, it is possible to achieve a substantially conformal (uniform thickness) layer (film) of photoresist, as well as provide a top anti-reflective coating in the same process. The resulting structure will resemble that shown in FIG. 2b.

In either case, solution or suspension (together referred to as "mixture"), the wafer is withdrawn from the mixture when it is determined that a sufficient amount of photoresist solids have precipitated onto the face of the wafer. This may be accomplished by withdrawing the wafer from the mixture (at the appropriate time), or by "decanting" the mixture from the reservoir (again, at the appropriate time). Either of these techniques are straightforward, and will be understood by those skilled in the art to which the present invention most nearly pertains.

MECHANISM FOR SUPPORTING WAFER

In the techniques discussed above, the semiconductor wafer is simply placed flat on the bottom of the reservoir, and it is ensured that there are sufficient, typically much more than sufficient, solids present in the mixture (solution or suspension) above the wafer to deposit a conformal layer of desired thickness. The need to limit the time that the wafer is exposed to sedimentary deposition from the mixture may be viewed as a shortcoming. Hence, it is proposed to avoid this shortcoming.

In any given mixture (solution or suspension) of photoresist solids, it can be assumed that the distribution of solids is fairly uniform throughout the mixture (especially if the mixture is agitated). It can also be determined how much, up to 100%, of the photoresist solids will precipitate out of the mixture (i.e, when an anti-solvent is added, when the ultrasonic transducer is turned off, etc.).

According to this embodiment of the invention, the wafer is supported at a known, elevated position within the reservoir so that there is a portion of the mixture below the wafer and a portion of the mixture above the wafer. The latter is of primary concern. The elevation of the wafer is determined to be at a position where there is just enough mixture above the wafer so that whatever percentage of solids are expected to precipitate out of the mixture will correspond to a given thickness of the desired conformal layer on the wafer.

Figure 4:
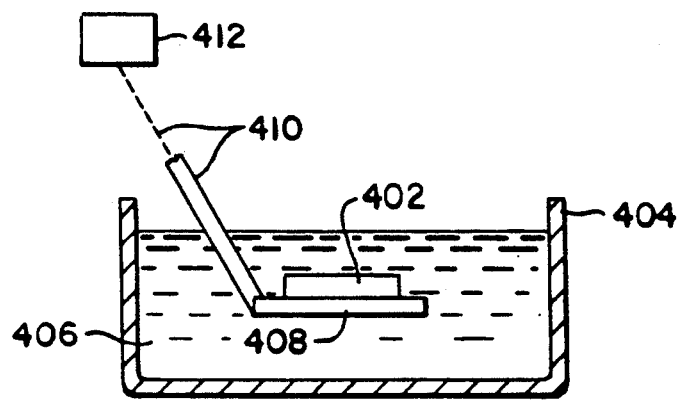
FIG. 4 is a cross-sectional view of yet another embodiment of the invention.

FIG. 4 shows apparatus for accomplishing this objective. A semiconductor wafer 402 is supported, in a reservoir 404 containing a mixture 406 of photoresist solids, on a platform (stage, carrier) 408. The wafer stage 408 is mechanically connected with a suitable linkage 410 to an actuator, such as a stepper motor 412. The motor 412 is capable of positioning the wafer at any predetermined level (height, as viewed) within the reservoir.

Notably, the wafer 402 is positioned within the reservoir at a position where there is a known quantity of mixture 406, containing a known quantity of dissolved or suspended photoresist solids, in a portion of the mixture above (as viewed) the wafer. This known quantity of solids corresponds to a desired thickness of the conformal photoresist layer sought to be deposited on the wafer.

Employing any of the mixtures/techniques described above for forming a sedimentary layer of photoresist on the face of the wafer, the wafer is allowed to reside in the mixture for a period of time sufficient to ensure full (rather than partial, as was described above) precipitation of the photoresist solids onto the face of the wafer. Evidently, only those solids contained in the portion of the mixture above the wafer will deposit themselves onto the face of the wafer. At the end of this time, the wafer is withdrawn from the mixture, by actuating the motor 412.

COMPENSATING FOR THICKNESS VARIATIONS

Notwithstanding the above, assuming that a perfectly conformal, perfectly uniform thickness of photoresist is not obtained, and there are lingering nonuniformities in reflectance manifesting themselves in unacceptable cd variations, and notwithstanding compensating for these reflectance nonuniformities by applying an overlying TAR, we are left with a non-uniform layer of photoresist exhibiting nonuniform reflectance, and the cd problems that ensue. Albeit, the non-uniformities may be much less than could otherwise (without employing sedimentary deposition of photoresist) have been obtained.

As mentioned above, based on a general knowledge of the characteristics of large troughs (or islands), vis-a-vis small troughs, the reflectance issue can be addressed in a general way by differentially biasing the photomask—namely, making some lines in the mask bigger (or smaller, as the case may be) to compensate for nonuniform reflectance and nonuniform absorption of energy (photolithography illumination). This is, of course, based largely on large area assumptions.

U.S. Pat. No. 4,977,330 discloses an in-line photoresist thickness monitor. A determination of photoresist thickness is made by fiber optics illuminating the coated wafer and measuring light scattered back from each illuminated portion of the wafer. This patent is cited as an example of existing equipment which can measure photoresist thickness.

According to the invention, thickness variations in the photoresist layer are measured and mapped (i.e., recorded, such as in a computer memory). This information about photoresist thickness is used to determine (calculate and map) the reflectivity, point-to-point, of the photoresist layer (see FIG. 1c, above). The reflectivity data is used to control the exposure dose (intensity×time) of subsequent point-by-point (versus blanket) optical semiconductor fabrication processes, such as e-beam lithography, or the like. At points on the wafer exhibiting greater reflectance, the exposure dose is increased, and vice-versa. In this manner, the resulting absorption by the photoresist layer can be uniformized, point-to-point, irrespective of thickness (reflectance) variations in the photoresist layer. Hence, better control over the cd of underlying features being fabricated can be effected.

In a variation on the theme of measuring thickness and calculating reflectance, the reflectance can be measured directly and used to control e-beam (or the like) exposure dose.

Figure 5:
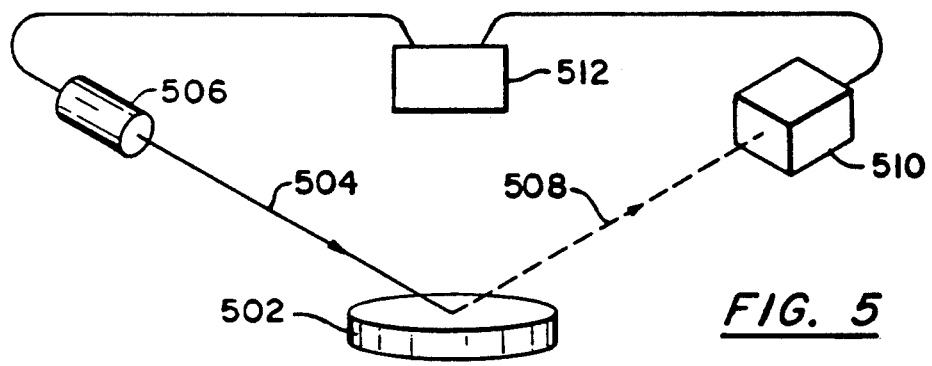
FIG. 5 is a perspective view of yet another embodiment of the invention.

FIG. 5 shows a semiconductor wafer 502, assumed to have a nonconformal layer of photoresist on its top (as viewed) surface. A beam 504 from a laser apparatus 506 is scanned, point-by-point, across the front surface of the wafer. Using a suitable angle of incidence for the beam, a large percentage of the beam will be absorbed by the photoresist layer. (Of course, the intensity and wavelength of the laser must be selected so as not to damage the semiconductor devices on the wafer.) However, in proportion to the reflectance of the wafer at any given point, some of the beam 504 will be reflected off of the front surface of the wafer, as indicated by the dashed line 508. The intensity of the reflected beam 508 is readily measured by a dosimeter 510, or the like.

The laser is under the control of a computer 512, or the like, which directs the scanning of the beam in any known manner, such as raster scanning. Hence, the position of the beam 504 is well controlled. Simultaneously, the output of the dosimeter 510 is monitored by the computer 512, which then creates a "map" (not shown) of reflectance versus position on the wafer. This map is used to control the exposure dose of subsequent optical processing apparatus, such as e-beam lithography, as discussed above.

ALTERNATE EMBODIMENT

Hereinabove, it has been described how a semiconductor wafer, or substrate, can be provided with a conformal layer of photoresist deposited on the substrate, wherein the layer of photoresist has a substantially uniform thickness over substantially the entire top surface of the substrate. And, it has been discussed how this desired result can be achieved by immersing a wafer in a reservoir. By way of review, a substrate (wafer) initially has a generally flap top (front) surface. Features, such as oxide regions, poly gates, and the like, are formed on the surface of the substrate, and create topographical irregularities on the top surface of the substrate. It should be realized that depositing photoresist over such a substrate, whether conformally or not, is an interim step in the processing of the substrate. In this regard, the wafer (substrate) can be considered to be "in-process" when the photoresist is applied.

According to an embodiment of the invention, the wafer is not immersed in a reservoir containing a mixture (solution or suspension) of photoresist. Rather, the mixture is applied, such as with spin-on techniques, directly to the surface of the wafer.

Figure 6:
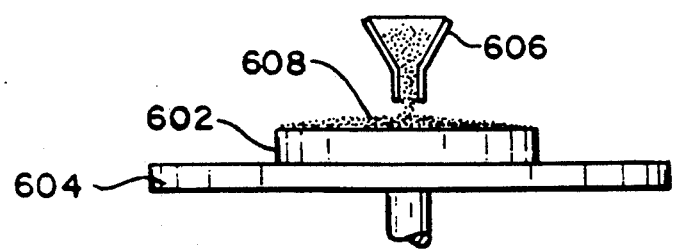
FIG. 6 is a cross-sectional view of another embodiment of the invention.

FIG. 6 shows a technique for providing a conformal layer of photoresist over a wafer, without a reservoir. A wafer 602 is mounted, such as by vacuum chucking, to a rotatable platen 604. A thickened mixture of photoresist is applied to the front surface of the wafer from a supply 606. The thickened mixture is shown at 608, exiting the supply 606 onto the front surface of the wafer 602. The platen is rotated, so that the mixture spreads itself over the front surface of the wafer.

The thickened mixture is sufficiently thick so as to stay on the front surface of the wafer. Surface tension and adhesion will ensure that a quantity of the thickened mixture will reside on the surface of the wafer. For example, a high solid content solution of photoresist can be applied in this manner. In a manner similar to that described with respect to the previous embodiments, the photoresist solids are allowed/caused to sediment (precipitate) out of the mixture, in this case the mixture on the surface of the wafer, so that the solids are deposited as a conformal layer on the surface of the wafer. For example, a solution of photoresist is applied from a supply to the surface of the wafer, the supply is removed, and an anti-solvent is applied (from another, similar supply, not shown) to the mixture on the surface of the photoresist to cause the photoresist to sediment. In this manner, the use of a reservoir is avoided.

What is claimed is:

1. Method of applying a conformal layer of photoresist over an underlying semiconductor wafer, comprising:

immersing a semiconductor wafer in a mixture of liquid and photoresist solids;

disposing the wafer in the mixture so that a face of the wafer intended to be coated by the photoresist solids is oriented upward, so that photoresist solids precipitating out of the solution will deposit themselves in a conformal manner on the face of the wafer, uniformly across the face of the wafer; and causing the photoresist solids to precipitate out of the mixture as a conformal layer of photoresist onto the semiconductor wafer.

2. Method according to claim 1, wherein:

the liquid is a solvent with respect to the photoresist solids; and the mixture is a solution of photoresist solids in the solvent.

3. Method according to claim 2, wherein:

the solvent is ethyl lactate; and the solids are novolac resin.

4. Method of applying a conformal layer of photoresist over an underlying semiconductor wafer, comprising:

immersing a semiconductor wafer in a mixture of liquid and photoresist solids; and causing the photoresist solids to precipitate out of the mixture as a layer of photoresist onto the semiconductor wafer; wherein:

the liquid is a solvent with respect to the photoresist solids;

the mixture is a solution of photoresist solids in the solvent; and the solvent has a relatively high polarity; further comprising:

adding a relatively non-polar substance to the solution to cause the photoresist solids to sediment out of solution onto the wafer.

5. Method of applying a conformal layer of photoresist over an underlying semiconductor wafer, comprising:

immersing a semiconductor wafer in a mixture of liquid and photoresist solids; and causing the photoresist solids to precipitate out of the mixture as a layer of photoresist onto the semiconductor wafer; wherein:

the liquid is a solvent with respect to the photoresist solids;

the mixture is a solution of photoresist solids in the solvent; and the solvent is ethyl lactate; and the solids are novolac resin; further comprising:

adding hexane to the solution to cause the photoresist solids to sediment out of solution onto the wafer.

6. Method according to claim 1, wherein:

the liquid is water; and the mixture is a suspension of photoresist solids in water.

7. Method according to claim 6, wherein:

the water is deionized water.

8. Method according to claim 6, further comprising:

allowing a residual, thin film of water to overly the conformal photoresist layer.

9. Method according to claim 1, further comprising:

applying a top antireflective coating over the conformal photoresist layer.

10. Method according to claim 1, further comprising:

supporting the wafer at the bottom of a reservoir containing the mixture; and withdrawing the wafer from the reservoir after a residence time in the reservoir.

11. Method according to claim 1, further comprising:

determining an elevated position in a reservoir at which a portion of the mixture above said position contains an amount of photoresist solids corresponding to a desired thickness of a layer of photoresist to be deposited on the wafer;

supporting the wafer at the elevated position in the reservoir;

allowing the photoresist solids in the mixture to sediment, those solids in the portion of the mixture above said elevated position forming a substantially conformal layer of photoresist on a face of the wafer.

12. Method according to claim 4, further comprising:

applying a top antireflective coating over the conformal photoresist layer.

13. Method according to claim 4, further comprising:

supporting the wafer at the bottom of a reservoir containing the mixture; and withdrawing the wafer from the reservoir after a residence time in the reservoir.

14. Method according to claim 4, further comprising:

determining an elevated position in a reservoir at which a portion of the mixture above said position contains an amount of photoresist solids corresponding to a desired thickness of a layer of photoresist to be deposited on the wafer;

supporting the wafer at the elevated position in the reservoir;

allowing the photoresist solids in the mixture to sediment, those solids in the portion of the mixture above said elevated position forming a substantially conformal layer of photoresist on a face of the wafer.

15. Method according to claim 5, further comprising:
applying a top antireflective coating over the conformal photoresist layer.

16. Method according to claim 5, further comprising:
supporting the wafer at the bottom of a reservoir containing the mixture; and
withdrawing the wafer from the reservoir after a residence time in the reservoir.

17. Method according to claim 5, further comprising:
determining an elevated position in a reservoir at which a portion of the mixture above said position contains an amount of photoresist solids corresponding to a desired thickness of a layer of photoresist to be deposited on the wafer;
supporting the wafer at the elevated position in the reservoir;
allowing the photoresist solids in the mixture to sediment, those solids in the portion of the mixture above said elevated position forming a substantially conformal layer of photoresist on a face of the wafer.

* * * * *